United States Patent
Jiang et al.

(10) Patent No.: US 7,224,218 B1
(45) Date of Patent: May 29, 2007

(54) PRE-CHARGE APPARATUS AND METHOD FOR CONTROLLING STARTUP TRANSIENTS IN A CAPACITIVELY-COUPLED SWITCHING POWER STAGE

(75) Inventors: Jiandong Jiang, The Colony, TX (US);
Lingli Zhang, Austin, TX (US);
Johann Gaboriau, Austin, TX (US);
John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/165,637

(22) Filed: Jun. 24, 2005

(51) Int. Cl.
*H03F 3/38* (2006.01)
(52) U.S. Cl. .................... 330/10; 330/251; 327/132
(58) Field of Classification Search .......... 363/147, 363/41, 49, 95, 97, 39, 16, 56.1; 323/316, 323/901, 908, 274; 455/212, 194; 330/297, 330/279, 10, 251; 327/132, 137
See application file for complete search history.

(56) References Cited

U.S. PATENT DOCUMENTS

| | | | |
|---|---|---|---|
| 5,642,076 A * | 6/1997 | Naokawa et al. | 330/149 |
| 6,385,056 B1 * | 5/2002 | Gucyski | 363/15 |
| 6,525,517 B1 * | 2/2003 | Hojo et al. | 323/316 |
| 6,538,590 B1 | 3/2003 | Gaborieau et al. | |
| 6,573,787 B2 * | 6/2003 | Ikin | 330/51 |
| 6,775,164 B2 * | 8/2004 | Wong et al. | 363/147 |

* cited by examiner

*Primary Examiner*—Rajnikant B. Patel
(74) *Attorney, Agent, or Firm*—Andrew M. Harris; Mitch Harris, Atty at Law, LLC

(57) ABSTRACT

A pre-charge apparatus and method for controlling startup transients in a capacitively-coupled switching power stage provide lower cost and improved startup transient performance in Class D amplifiers, as well as in other AC power converter applications. A charging source is activated at startup to control the charging of an external capacitor from a single power supply rail to an operating point voltage equal to the average DC output of the switching circuit, while a control circuit disables the output power stage of the switching converter. The current source may be a constant-current source and/or may be controlled via feedback from the voltage or current at the output terminal of the converter to taper the current level to more accurately control the charging. A discharge circuit can also be provided to discharge the output terminal to an opposite power supply rail before commencing the controlled charging.

20 Claims, 4 Drawing Sheets

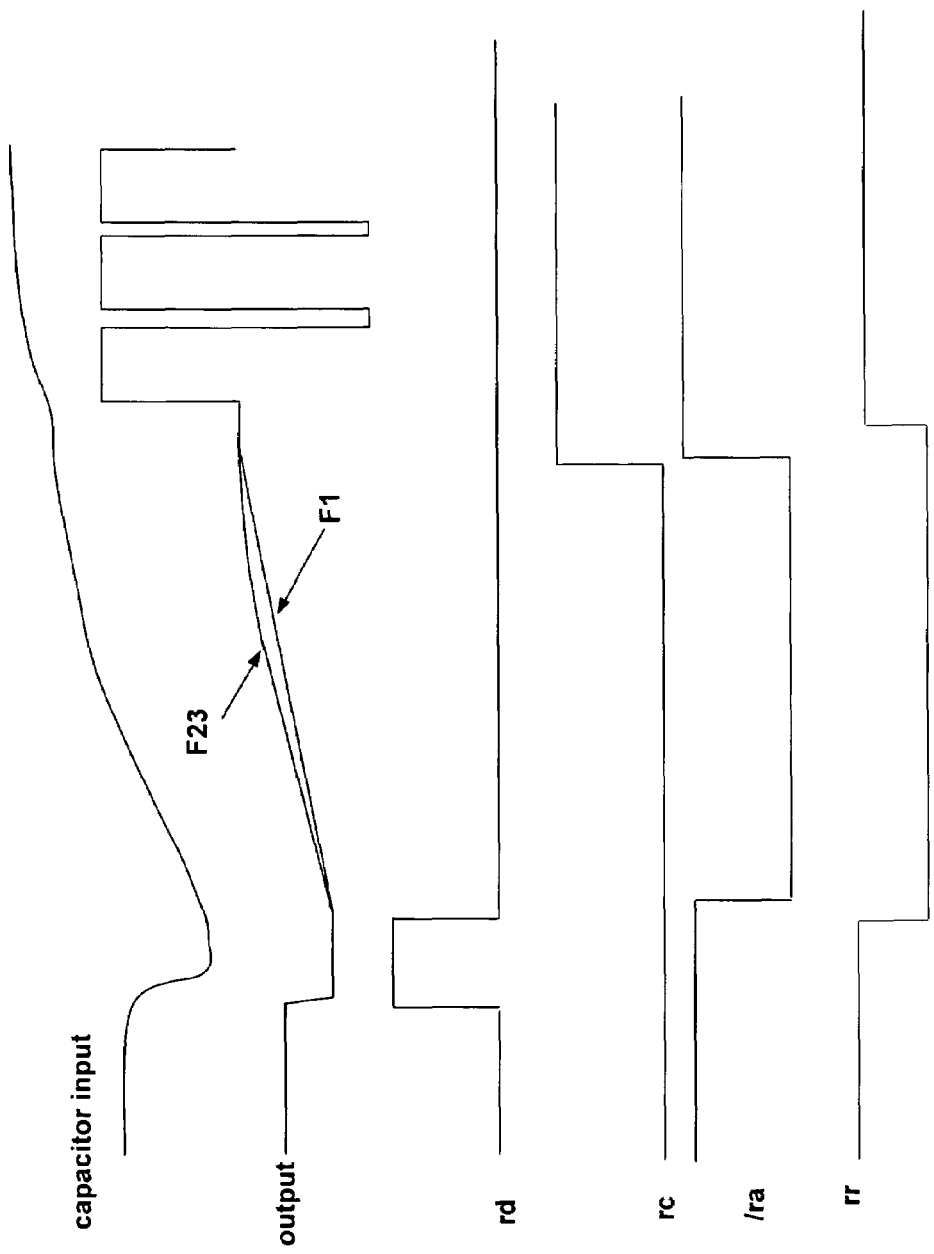

PRE-CHARGE APPARATUS AND METHOD FOR CONTROLLING STARTUP TRANSIENTS IN A CAPACITIVELY-COUPLED SWITCHING POWER STAGE

BACKGROUND OF THE INVENTION

1. Field of the Invention

The present invention relates generally to integrated circuit power converters for providing an AC power output, and more specifically, to circuit and method for managing startup transients in the AC output.

2. Background of the Invention

AC output switching power converters are currently in widespread use. In particular switching power converters are commonly used in automotive amplifiers and other amplifiers in which a high power output is produced from an available DC voltage that is too low to deliver the desired power to a fixed impedance load. Switching power converter amplifiers, sometimes referred to as Class D amplifiers, also have higher efficiency than linear amplifiers, making them well suited for battery driven applications and applications where power dissipation in the form of heat is a problem, such as very high power professional audio applications, as in concert halls.

Another application of AC power converters is to provide an AC power source for operating line powered devices when only battery power is available. AC power inverters are in common use for this application and provide for operation of line-powered equipment in automobiles and other locations where only DC battery power is available.

Switching AC power converters can either be single ended (half-bridge) or double-ended (full-bridge). The full-bridge configuration is commonly used, as the half-bridge configuration requires a DC blocking capacitor if the average DC voltage of the output stage is not the same voltage as the load return connection. In typical automotive applications, the power supply is single-ended, and therefore the operating point for a 12VDC system is 6V and not ground. However, single-ended output stages are more space efficient in that only two output stage devices are required per channel and the on-resistance of the devices can be twice that of the corresponding full-bridge design, as only one device is in series with the load at a time.

In the half-bridge circuit at startup, without special startup circuitry, the converter switching stage must generate pulses (or switch one driver on continuously) to drive the output upward from zero volts to the midpoint of the power supply or other operating point, causing a transient to appear on the output of the converter. In amplifier applications, this transient is undesirable, as it is heard through speakers as a "pop" or "click" and in extreme cases may cause damage to the load.

Therefore, startup circuits are employed in AC output power converters that are capacitively-coupled, so that the transient is not produced or is minimized. One such circuit provides a resistor divider with equal value resistors connected between the power supply rails and the output of the power converter. At startup, the converter power stage is held off by a timing circuit and the resistor divider slowly charges the output terminal to the DC operating point voltage. The resistor divider must typically be provided outside of an integrated circuit power amplifier, and thus increases parts count and cost of the circuit.

The above-mentioned resistor divider technique requires either precision resistors, or the circuit will generate a DC offset at the output of the amplifier which yields another transient when the power converter start. If there is no DC feedback from the output, the offset will remain at the output during operation, affecting performance of the amplifier. The resistor technique is also unsuited for automotive applications in which the current drawn through the resistors is continuously present even if the amplifier is producing no output signal. In general, the presence of the resistor divider lowers the power efficiency of the amplifier. The resistance of the divider must be reasonably low in order to keep the startup time short, so the lower resistance leads to high sink currents through the divider.

An alternative technique that overcomes the drawbacks of the resistor divider and that can be integrated within the converter integrated circuit is described in U.S. Pat. No. 6,538,590 to Gaboriau, et al. A second output driver stage connected to the output of the converter drive electronics is connected via a resistor to the output terminal, essentially in parallel with the output drivers. By disabling the primary output drivers until a predetermined time has passed, the second output driver provides a lower current drive level that more gradually raises the voltage at the output terminal to the power supply midpoint. However, the technique disclosed therein does not so much control the startup transient, but rather reduces the output drive level during the unstable period of startup in the switching output stage.

Therefore, it would be desirable to provide a method and system for controlling startup transients in a capacitively coupled switching power converter that does not require continuous current after startup or components external to an integrated circuit.

SUMMARY OF THE INVENTION

The above stated objective of controlling startup transients in a capacitively coupled switching power converter is achieved in a startup control circuit and method of operation of the startup control circuit.

The circuit includes a controlled charging circuit for sourcing a continuous DC current from a single power supply rail of the converter during startup to provide a controlled current at an output terminal of the converter for charging an external coupling capacitor between the output terminal and a load. The circuit further includes a control circuit for disabling any switching output of the power converter while the capacitor is being charged and detecting and providing indications to circuits when charging is complete. The charging circuit is disabled once the charging is complete, so that no power is dissipated by the charging circuit thereafter.

The charging circuit may be a constant or adaptive current source and the circuit may further include another transistor for discharging the output terminal to the opposite power supply rail prior to the startup charging to the DC operating point of the power stage. The circuit may also include a feedback circuit for sensing a voltage at the output terminal or detecting the charging current and adjusting the charging current in conformity with the sensed level.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

FIG. 4 is a signal diagram depicting signals within the circuits depicted in FIGS. 1–3.

DESCRIPTION OF ILLUSTRATIVE EMBODIMENT

The present invention encompasses a circuit and method of operation that pre-charge a coupling capacitor that couples an output terminal of an AC output switching power converter, such as a Class D power amplifier, to a load. The capacitor is pre-charged to an operating point, which is generally the midpoint of the power supply swing of the output terminal at full load/full power. In essence, the DC operating point is dictated by the quiescent pulse width of the converter, which is chosen for maximum dynamic range in an amplifier design. The charging is performed via a controlled source from single power supply rail so that the switching converter does not present an unstable or uncontrolled transient behavior at the converter output which may cause audible "popping" at the output of an amplifier and possibly cause damage to the converter load. The single rail source causes the capacitor to charge quickly, as opposed to prior art solutions that feed current from both power supply rails that effectively oppose each other to determine the voltage. The pre-charge source charges the coupling capacitor, and is disabled after the voltage on the coupling capacitor has reached the operating point voltage. The use of a current source allows a shorter and more stable startup time than an exponential charging such as the prior art resistor circuit mentioned above, as the charging period can be closely controlled and can be made adaptive.

The pre-charge circuit is activated during an initialization period when the switching converter power stage is disabled and sources a current from a charging circuit that charges an external coupling capacitor connected between the output terminal and a load through at least one internal transistor for controlling the pre-charging current. After a determination that the converter output terminal current or voltage indicates that the output terminal voltage (and hence the voltage across the external coupling capacitor) is substantially equal to the operating point voltage, the charging circuit is disabled and the converter power stage is enabled to provide the normal operation of the converter AC output terminal.

Figure 1:
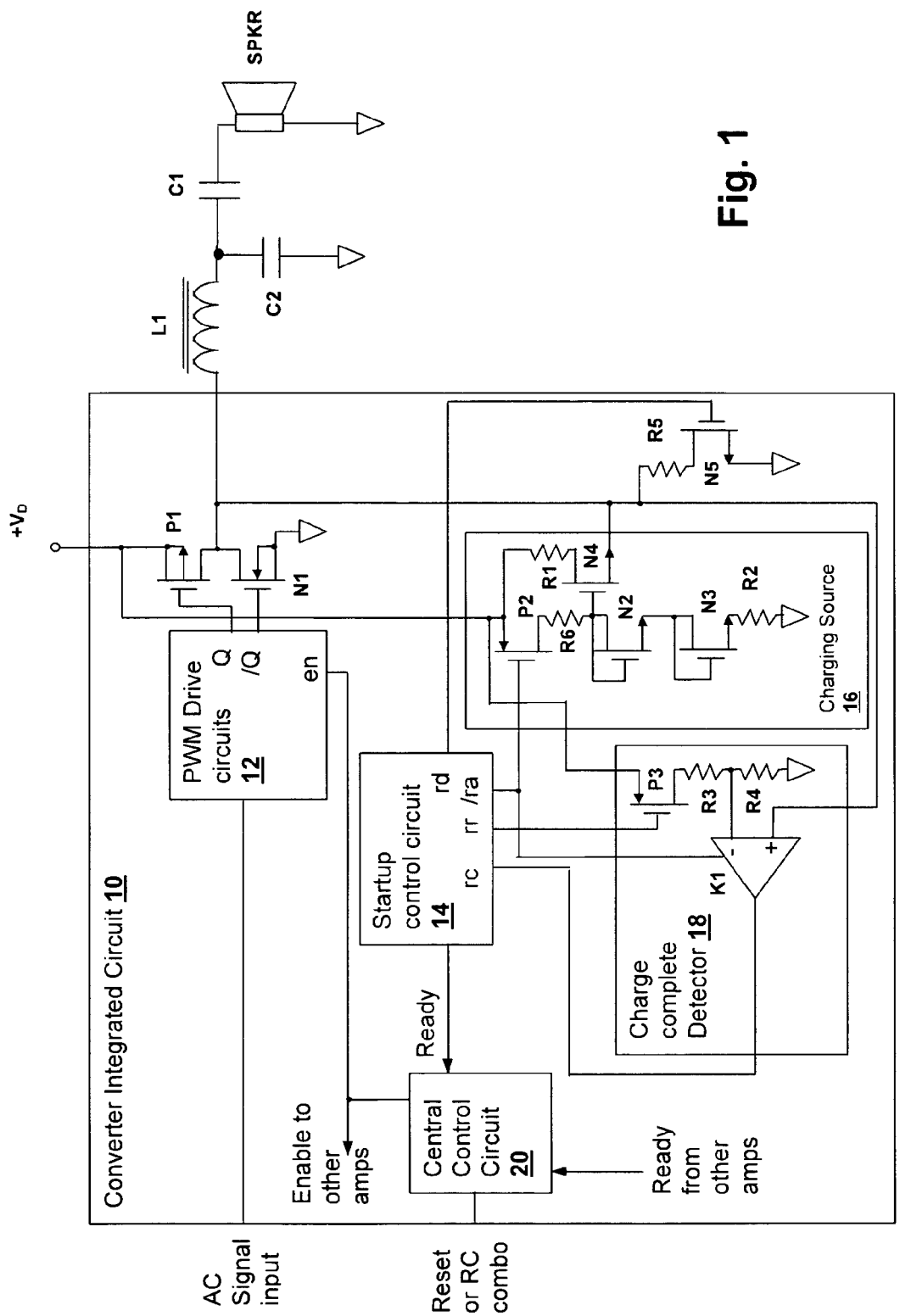
FIG. 1 is a schematic diagram depicting a circuit in accordance with an embodiment of the invention.

Referring now to the figures, and in particular to FIG. 1, a converter circuit in accordance with an embodiment of the present invention is depicted. A converter integrated circuit 10 includes a single-ended half-bridge output formed by transistors N1 and P1 that provides a switching pulse-width modulated output signal to an exemplary load, speaker SPKR, through an LC filter comprising inductor L1 and capacitor C2. A coupling capacitor C1 isolates load SPKR from the DC value at the output terminal of converter integrated circuit which is ideally at full load/full power midpoint voltage of the power supply rails supplied to converter integrated circuit 10, which is also generally the midpoint of the output swing of the converter power stage (transistors N1 and P1).

Transistors N1 and P1 are controlled by pulse width modulation (PWM) drive circuits 12 that periodically and alternatively pulse transistors N1 and P1 on to provide a bi-polar pulsed output at the output terminal of converter integrated circuit 10 that is connected to inductor L1. The filter provided by inductor L1 and capacitor C2 smooth the pulsed signal into the desired AC waveform, which is an amplified replica of the AC input signal being amplified as provided at an input to converter integrated circuit 10. An enable input signal is provided to PWM drive circuits 12 from a central control circuit 22 to disable pulsing from PWM drive circuits 12, thereby disabling transistors N1 and P1. Central control circuit 22 combines a ready indication from multiple power amplifiers within converter integrated circuit 10 so that once all amplifiers are ready, all of the amplifiers are enabled simultaneously. Alternatively, startup control circuit 14 can be connected directly to the enable input of PWM drive circuits 12 if global control is not needed or if converter integrated circuit 10 contains only one amplifier and an external central control circuit 22 is not used to ensure that all of a number of amplifiers are ready prior to being enabled, which is yet another alternative.

Startup control circuit 14 indicates that the amplifier is not ready after initialization and until capacitor C1 is charged to the operating point voltage by a charging source 16. Startup control circuit 14 receives an external reset signal (or may include an RC power-on comparator circuit with internal or external capacitor/resistor for timing startup) and provides signals to control the startup and charging operation of the amplifier, as well as the ready signal to central control circuit 22. Coupling capacitor C1 is discharged though a resistor R5 under control of transistor N5 prior to commencement of charging, so that a known time period will always be required for charging to the operating point voltage, and so that the voltage on coupling capacitor C1 can never start at a voltage higher than the operating point voltage. Transistor N5 is controlled by the rd signal output of startup control circuit 14, and is activated for a known period prior to assertion of the ramp control signal ra that commences charging of coupling capacitor C1.

Charging source 16 is provided by a source follower transistor N4 fed by a resistor R1. The current provided by source follower to the amplifier output terminal is set by the on-resistance of transistor N4 and the resistance of resistor R1. The charging current is:

$$I_{out} = V_D - V_{out}/(R_{R1}+R_{N4})$$

Transistor N4 is controlled by a ladder formed by resistor R2 and transistors N2 and N3 with a source provided by transistor P2 through resistor R6. The above described ladder provides a voltage on the gate of transistor N4 that is approximately an N-channel threshold voltage above the operating point voltage. Resistor R6 and R2 are set to equal values, so the voltage at the gate of N4 is approximately $V_D/2+V_T$, assuming that the voltage drop across P2 is essentially equal to the N-channel threshold voltage. According to the equation above, the charging current will decrease as the difference between the power supply voltage and output terminal voltage decreases.

A comparator K1 is included to compare the output voltage to a reference voltage provided by a resistor divider formed by resistors R3 and R4 that is disabled by transistor P3 after the coupling capacitor charging is complete by signal rr, in order to save power. The voltage provided by the above-described resistor divider will be slightly lower than $V_D/2$ due to the on-resistance of transistor P3 if resistors R3 and R4 are set equal. Comparator K1 preferably is a low-offset high gain comparator. Further, the layout and floor plan of comparator K1 and associated circuits should be considered for low noise and to ensure stability of the comparator inputs and outputs. A ramp complete control signal rc is provided by comparator K1 to startup control circuit 14, which then disables comparator K1, charging source 19 (by disabling transistor P2) provides the ready indication that enables the PWM drive control 12 or signals central control circuit 22 so that the amplifier(s) can operate to amplify the AC input signal. If converter integrated circuit 10 contains multiple amplifiers, the ramp complete signal of each amplifier can be combined to qualify the PWM drive circuits, so that all amplifiers are enabled in functional mode only after each has been pre-charged.

Figure 2:
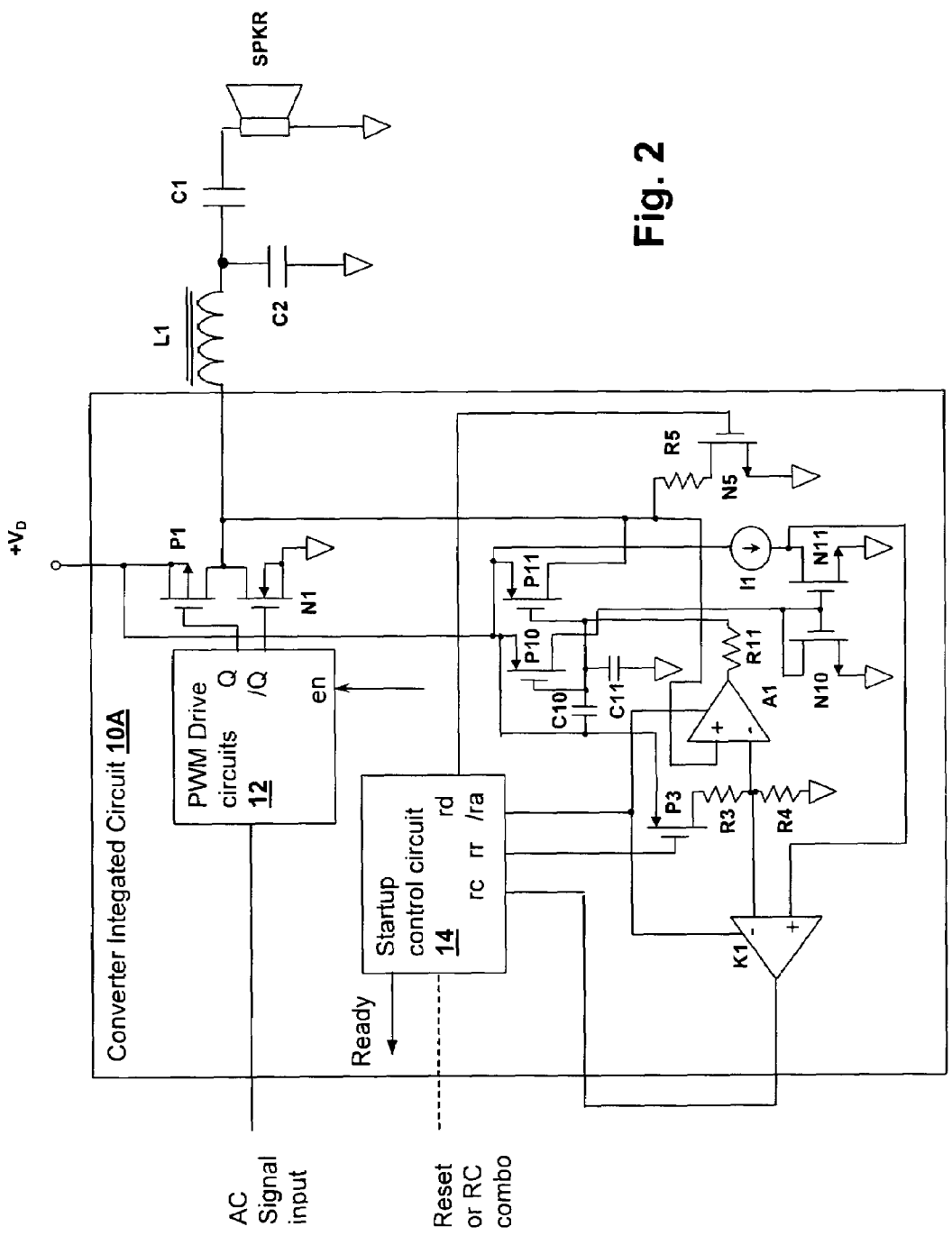
FIG. 2 is a schematic diagram depicting a circuit in accordance with another embodiment of the invention.

Referring now to FIG. 2, a converter integrated circuit 10A in accordance with another embodiment of the invention is depicted. The circuit of FIG. 2 is similar to that of FIG. 1, and therefore only differences between them will be described below. The charging source in the embodiment of FIG. 2 includes an adaptive current control in amplifier A1, which is an operational amplifier with either a comparatively low gain or a level of built-in negative feedback. Amplifier A1 controls the charging current supplied by transistor P11 in conformity with the difference between the output terminal voltage and the reference voltage supplied by the reference voltage divider implemented by resistors R3 and R4. Since the gate voltage of P10 is linearly proportional to the difference between the operating point voltage and the output terminal voltage, the charging current decreases correspondingly. The above described circuit has advantages in that the current produced by the charging circuit is controlled with feedback, and has no dependence on the magnitude of the voltage $V_D$ in contrast to the circuit of FIG. 1. The charging current is given by the following equation:

$$I_{out} = K(V_{out} - V_{operating\ point})$$

Where K represents the transconductance of transistor P11 multiplied by the gain of amplifier A1. By setting the gain of amplifier A1 appropriately, the charging rate can be controlled accordingly and transistor P11 sized so that the square-law behavior of transistor P11 near cut-off decreases the rate at which the output current decreases. (The above linear equation is non-linear when the effect of cutoff in transistor P11 is considered.)

A current mirror formed by transistors N10 and N11 provides a charging state measuring input to comparator K1. The current mirror reflects the charging current supplied to the output terminal of converter integrated circuit 10A that charges coupling capacitor C1, since the current through transistor P11 that supplies the charging current will be equal to the current through transistors P10 and N10 when all of the above-listed transistors are operated linearly. A reference current source I1 produces a reference current through transistor N11 and when the charging current becomes less than the value of current source I1, transistor N11 is saturated and the voltage at the junction of I1 and transistor N11 rises rapidly. When the voltage at the junction of I1 and transistor N11 rises, comparator K1 trips, signaling startup control circuit to stop the ramp by deasserting signal ra.

Figure 3:
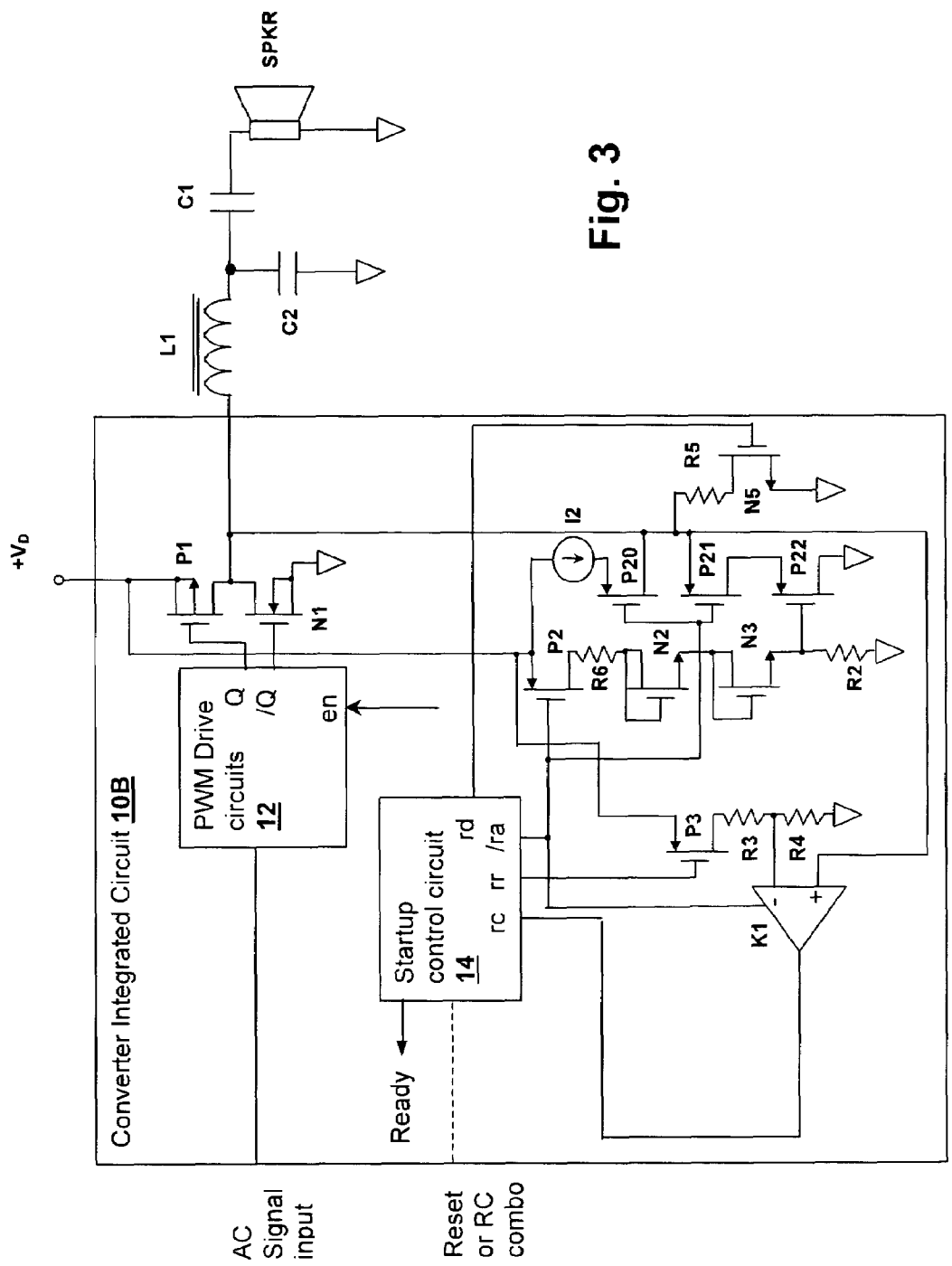
FIG. 3 is a schematic diagram depicting a circuit in accordance with yet another embodiment of the invention.

Referring now to FIG. 3, a converter integrated circuit 10B in accordance with yet another embodiment of the invention is depicted. The circuit of FIG. 3 is also similar to that of FIG. 1, and therefore only differences between them will be described below. The charging source in the embodiment of FIG. 3 includes a current bypass circuit provided by transistors P21 and P22 as well as charging control transistor P20 which charges the output terminal from current source 12 when the /ra signal is asserted low. Transistor P22 is biased by the ladder comprising transistors P2, N2, N3, R6 and R2 to a voltage that is approximately one N-channel threshold voltage below the operating point voltage. When charging begins, transistor P22 is not conducting as its source to gate voltage is negative. Transistor P22 thus remains non-conducting until the voltage at the output terminal has reached a voltage approaching an N-channel threshold below the operating point voltage, at which point the current from current source 12 via transistor P20 is shunted through transistors P21 and P22 which slows the rate of voltage ramp-up on the output terminal. As described above with respect to FIG. 1, comparator K1 detects when the output terminal voltage has reached the reference level and causes startup control circuit to deassert /ra (high), which turns off transistor P2 and comparator K1 to save power and transistors P21 and P20 to stop the charging/discharging.

Referring now to FIG. 4, a signal diagram is shown that illustrates operation of the above-described circuits. In response to an initialization indication, which may be an external reset, power supply initialization detection or any other initialization indication as is known to those of skill in the art, the ramp down signal rd is asserted, causing the output terminal and capacitor input terminal to be pulled to the negative power supply rail as shown. After a predetermined time has elapsed, signal rd is de-asserted and signals rr and /ra are asserted to start the ramp up. For stability reasons, signal rr is shown as enabled prior to the assertion of signal /ra and remains enabled for a period after signal /ra is de-asserted, which may not be necessary for all embodiments of the invention, but ensures that the reference voltage is stable prior to starting the ramp and after completing the ramp. Once signals /ra and rr are both asserted, the output terminal voltage and capacitor input voltage begin to rise toward the operating point and as the operating point is approached, curve F23 illustrates the adaptive behavior of the embodiments of FIGS. 2 and 3 while curve F1 illustrates the more linear behavior of the embodiment of FIG. 1. After signal /ra is de-asserted, the power stage is enabled to switch pulses onto the output terminal as shown and that is reflected in the AC output signal after filtering by inductor L1 and capacitor C2 as the AC waveform seen at the input to the coupling capacitor as shown. The period for which the amplifier is shown in operational mode is extremely exaggerated in length, as the switching period of the PWM is on the order of 1 microsecond, whereas the charging ramp time is on the order of 1 second.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for controlling output transients in a switching power stage packaged in an integrated circuit and having an output terminal capacitively coupled to a load, said method comprising:
    disabling all output switches that are controlled by modulation signals of said switching power stage;
    pre-charging said output terminal via a pre-charge circuit within said integrated circuit from a single power supply rail to a voltage substantially equal to a predetermined average voltage operating point of said switching power stage;
    disabling said pre-charge circuit to stop said pre-charging in response to a determination that said pre-charging is complete; and
    enabling said output switches, wherein said switches are controllable to produce an AC signal across said load.

2. The method of claim 1, wherein said pre-charging is performed by a constant current source within said integrated circuit and wherein said disabling said pre-charge circuit disables said constant current source.

3. The method of claim 1, further comprising detecting when said voltage across said capacitor is substantially equal to said operating point, and wherein said pre-charging is deactivated in response to said detecting and wherein said enabling is performed in further response to said detecting.

4. The method of claim 1, wherein said switching power stage is a switching power stage of a switching power amplifier, and wherein said method further comprises controlling said output switches to reproduce an input signal of said switching power amplifier across said load.

5. The method of claim 1, wherein said pre-charging charges said capacitor with a substantially constant current.

6. The method of claim 1, wherein said pre-charging charges said capacitor with a non-constant current that is reduced as said voltage at said output terminal reaches said operating point.

7. The method of claim 6, further comprising:
mirroring a current level of said pre-charging to obtain a mirrored current level; and
comparing said mirrored current level to a reference current level, and wherein said determination indicating that said output terminal has reached a voltage substantially equal to said operating point is a determination that said mirror current level is less said reference current level as obtained in conformity with a result of said comparing.

8. The method of claim 6, wherein said pre-charging comprises:
charging said output terminal from a constant current source; and
shunting current away from said output terminal as an increasing function of a rise in said voltage of said output terminal, whereby said non-constant current is reduced as said voltage at said output terminal reaches said operating point.

9. The method of claim 1, further comprising discharging said output terminal prior to said pre-charging.

10. An integrated circuit, comprising:
an output terminal for providing an AC signal through an external series capacitor to a load;
a single-ended switching power stage having an output connected to said output terminal and controlled by at least one modulation signal;
a pre-charging circuit for charging said external series capacitor from a single power supply rail; and
a control circuit for disabling said switching power stage and activating said pre-charging circuit to charge said external series capacitor independent of a state of said at least one modulation signal, disabling said pre-charging circuit after said external series capacitor is charged to a voltage substantially equal to a predetermined average voltage operating point of said switching power stage, and enabling said switching power stage when said pre-charge circuit is disabled.

11. The integrated circuit of claim 10, further comprising a voltage comparator for detecting when said external series capacitor is charged to a voltage substantially equal to said operating point voltage, wherein said voltage comparator is coupled to said control circuit for deactivating said pre-charge circuit in response to an output of said detector.

12. The integrated circuit of claim 10, further comprising a comparator for detecting when a pre-charging current supplied by said pre-charging circuit to charge said external series capacitor has fallen below a predetermined current level, and wherein said comparator is coupled to said control circuit for deactivating said pre-charge circuit in response to an output of said detector.

13. The integrated circuit of claim 10, wherein said switching power stage is a switching stage of a switching power amplifier for reproducing an analog signal at said load in conformity with an analog input signal.

14. The integrated circuit of claim 10, wherein said pre-charging circuit comprises a switch transistor for selectively charging said external series capacitor with a substantially constant current when said pre-charging circuit is enabled.

15. The integrated circuit of claim 10, wherein said pre-charging circuit charges said capacitor with a non-constant current that is reduced as said voltage at said output terminal reaches said operating point voltage.

16. The integrated circuit of claim 15, further comprising:
a current mirror for mirroring a current level of said pre-charging to obtain a mirrored current level; and
a comparator for comparing said mirrored current level to a reference current level, and wherein said comparator has an output coupled to said control circuit for disabling said pre-charging circuit in response to said comparator detecting that said mirrored current level has fallen below a predetermined threshold.

17. The integrated circuit of claim 15, wherein said pre-charging circuit comprises:
a constant current source for supplying a pre-charging current to said output terminal; and
a current shunt for shunting current away from said output terminal as an increasing function of a rise in a voltage at said output terminal, whereby said non-linear current that is reduced as said voltage at said output terminal reaches said operating point voltage.

18. The integrated circuit of claim 10, further comprising a discharge circuit for discharging said output terminal prior to said pre-charging.

19. A switching power amplifier, comprising:
a single-ended switching power stage having an output connected to an output terminal of said switching power amplifier and controlled by at least one modulation signal provided in conformity with an AC input signal to be amplified;
a series capacitor connected between an output of said power stage and a load;
a pre-charging circuit having an output for charging said series capacitor from a single power supply rail to a voltage substantially equal to a predetermined operating point voltage;
a current mirror for mirroring a pre-charging current supplied by said pre-charging circuit to said series capacitor to provide a mirror current;
a detector for comparing a current level of said mirror current to a reference current level;
a feedback circuit for controlling said pre-charging circuit so that said pre-charging current is proportional to a difference between said operating point voltage and a voltage across said series capacitor; and
a control circuit for enabling said pre-charging circuit in response to an indication to initialize said switching power amplifier, disabling said pre-charging circuit in response to an output of said detector detecting that said mirror current has fallen below said reference current level, and enabling said power stage.

20. The switching power amplifier of claim 19, further comprising multiple other switching power amplifiers and wherein said control circuit is connected to said multiple other switching power amplifiers, so that said power stage of said power amplifier and other power stages of said multiple other switching power amplifiers are simultaneously enabled only in response to an output of said detector and outputs of detectors from each of said multiple other switching power amplifiers indicating that said series capacitor and other series capacitors connected between said other power stages and corresponding loads are charged to a voltage substantially equal to said operating point voltage.

* * * * *